United States Patent
Park et al.

(10) Patent No.: US 10,276,780 B2
(45) Date of Patent: Apr. 30, 2019

(54) SEMICONDUCTOR DEVICE, SEMICONDUCTOR DEVICE CONTROL METHOD AND OPTICAL SWITCH

(71) Applicant: KOREA ADVANCED INSTITUTE OF SCIENCE AND TECHNOLOGY, Daejeon (KR)

(72) Inventors: Byong Guk Park, Daejeon (KR); Dong Jun Kim, Daejeon (KR); Chul Yeon Jeon, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 15/868,837

(22) Filed: Jan. 11, 2018

(65) Prior Publication Data

US 2018/0205004 A1    Jul. 19, 2018

(30) Foreign Application Priority Data

Jan. 13, 2017    (KR) .................. 10-2017-0005900
Jan. 11, 2018    (KR) .................. 10-2018-0003639

(51) Int. Cl.

| | | |
|---|---|---|
| G11C 11/00 | (2006.01) | |
| H01L 43/02 | (2006.01) | |
| H01L 43/08 | (2006.01) | |
| H01F 10/32 | (2006.01) | |
| G11C 11/16 | (2006.01) | |
| H01L 43/10 | (2006.01) | |

(52) U.S. Cl.
CPC ........... *H01L 43/02* (2013.01); *G11C 11/161* (2013.01); *G11C 11/1673* (2013.01); *G11C 11/1675* (2013.01); *H01F 10/3286* (2013.01); *H01L 43/08* (2013.01); *H01F 10/3254* (2013.01); *H01L 43/10* (2013.01)

(58) Field of Classification Search
CPC .............. G11C 11/161; G11C 11/1673; G11C 11/1675; H01L 43/02; H01L 43/08; H01L 43/10
See application file for complete search history.

(56) References Cited

U.S. PATENT DOCUMENTS

| | | | |
|---|---|---|---|
| 5,699,293 A | 12/1997 | Tehrani et al. | |
| 5,986,925 A | 11/1999 | Naji et al. | |
| 7,345,911 B2 * | 3/2008 | Min ...................... | B82Y 10/00 257/E21.665 |
| 7,588,945 B2 * | 9/2009 | Min ...................... | B82Y 10/00 257/E21.665 |
| 8,416,618 B2 | 4/2013 | Gaudin et al. | |
| 9,330,748 B2 * | 5/2016 | Roizin ................. | G11C 11/161 |
| 2014/0169088 A1 | 6/2014 | Buhrman et al. | |
| 2017/0256704 A1 * | 9/2017 | Chuang ................ | H01L 27/228 |

FOREIGN PATENT DOCUMENTS

KR    10-1266791    5/2013

* cited by examiner

*Primary Examiner* — Pho M Luu
(74) *Attorney, Agent, or Firm* — Klarquist Sparkman, LLP

(57) ABSTRACT

Semiconductor devices and semiconductor device control methods are described. A semiconductor device comprises a first electrode; a cell arranged on the first electrode and including a magnetic tunnel junction (MTJ) having a free magnetic layer and a pinned magnetic layer with a dielectric layer in between them; and a heating element to form a thermal gradient in the first electrode.

16 Claims, 10 Drawing Sheets

SEMICONDUCTOR DEVICE, SEMICONDUCTOR DEVICE CONTROL METHOD AND OPTICAL SWITCH

CROSS REFERENCE TO RELATED APPLICATIONS

This application claims priority to KR Patent Application No. 10-2017-0005900, filed on Jan. 13, 2017 and KR Patent Application No. 10-2018-0003639, filed on Jan. 11, 2018, all of which are incorporated herein in their entirety.

BACKGROUND OF THE INVENTION

1. Field of the Invention

The present invention relates to a semiconductor device, a semiconductor device control method and an optical switch.

2. Description of the Related Art

Recent targets of study on the semiconductor device are magnetic memory device and phase change device. Among them, the magnetic memory device is characterized by fast speed and low operating voltage in addition to being non-volatile, so it is ideal for a memory device. In general, such magnetic memory device, as described in U.S. Pat. No. 5,699,293, is composed of a unit cell comprising one magnetoresistance sensor and one transistor.

The basic structure of the magnetic memory device includes the magnetic tunneling junction having two ferromagnetic materials with the dielectric layer in between (the first magnetic electrode/insulator/the second magnetic electrode). It provides information through the magnetoresistance of the device that would be changed according to the relative magnetization direction of the two different magnetic materials. The magnetization direction of those two magnetic layers can be regulated by spin-polarized current, which is called 'spin transfer torque' wherein angular momentum possessed by electrons is delivered to magnetic moment to cause torque.

To control the magnetization direction by using spin transfer torque, spin-polarized current needs to pass through inside the all layers of magnetic tunnel junction. However, a new technique, called spin orbit torque technique, has been proposed to induce magnetization switching of a magnetic material by in-plane current supply by placing a heavy metal inducing spin current close to the magnetic material [U.S. Pat. No. 8,416,618, Writable magnetic memory element, US 2014-0169088, Spin Hall magnetic apparatus, method and application, KR1266791, Magnetic memory device using in-plane current and electric field].

PRIOR ART REFERENCE

Patent Reference (Patent Reference 1) U.S. Pat. No. 5,699,293
(Patent Reference 2) U.S. Pat. No. 5,986,925

SUMMARY OF THE INVENTION

It is an object of the present invention to provide a semiconductor device characterized by fast speed of saving, recognizing, and transferring information and low energy consumption.

This device of the invention favors high integration, indicating the performance of the semiconductor device is improved but the production cost thereof is reduced.

The semiconductor device of the present invention can be applied to various fields by changing the magnetization characteristics of each cell.

A semiconductor device according to an example of the present invention comprises a first electrode; a cell arranged on the first electrode and including a magnetic tunnel junction (MTJ) having a free magnetic layer and a pinned magnetic layer with a dielectric layer in between them; and a heating element to form a thermal gradient in the first electrode.

Additionally, a magnetization direction of the free magnetic layer may be aligned in a perpendicular direction to a film direction to have a perpendicular anisotropy. Also, the heating element may be arranged on the first electrode.

Also, a direction in which the thermal gradient may be formed by the heating element is a direction of a current applied on the first electrode.

Also, the magnetization direction of the free magnetic layer may be changed depending on the thermal gradient formed by the heating element.

Also, the magnetization direction of the free magnetic layer may be changed by applying a in-plane current.

Also, the first electrode may have a thickness or width gradient in a direction of the current applied on the first electrode.

Also, the heating element may comprise a heating device.

Also, the heating element may comprise a material having a thermal conductivity lower than that of the first electrode.

Also, the semiconductor device may further comprise an insulation structure formed on at least a portion of the first electrode.

Also, the semiconductor device may further comprise a heat dissipating structure formed on at least a portion of the first electrode.

A method for controlling a semiconductor device according to an example of the present invention comprising a first electrode, a cell arranged on a first electrode and including a magnetic tunnel junction (MTJ) having a free magnetic layer and a pinned magnetic layer with a dielectric layer in between them, and a heating element to form a thermal gradient in the first electrode comprise the following steps of: changing a critical current value of the cell by forming a thermal gradient in the first electrode; and saving information on the cell by applying current in the first electrode.

Also, the method for controlling the semiconductor device may further comprise a step of reading the information of the cell by applying current through the first electrode and the cell.

Also, forming the thermal gradient in the first electrode may be performed by applying current on the heating element.

Also, forming the thermal gradient in the first electrode may be performed by irradiating energy source to the first electrode.

An optical switch according to an example of the present invention comprises a first electrode; and a cell arranged on a first electrode and including a magnetic tunnel junction (MTJ) having a free magnetic layer and a pinned magnetic layer with a dielectric layer in between them, wherein the first electrode comprises a light receiving element.

Also, the light receiving element change temperature by receiving an external energy source.

Advantageous Effect

The semiconductor device according to an example of the present invention is characterized by high speed of saving, recognizing, and transferring information, in addition to low energy consumption. The semiconductor device of the present invention facilitates high integration, resulting in the effect of improving performance of the semiconductor device and reducing production costs.

A critical current value for the spin orbit torque switching can be regulated by applying the heat.

The semiconductor device can be applied to various fields by changing the magnetization characteristics of each cell.

BRIEF DESCRIPTION OF THE DRAWINGS

The application of the preferred embodiments of the present invention is best understood with reference to the accompanying drawings, wherein.

DESCRIPTION OF THE PREFERRED EMBODIMENTS

Figure 1:
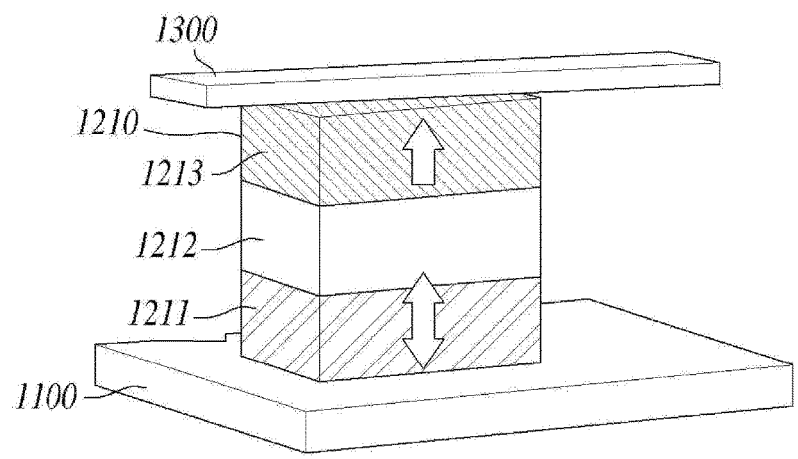
FIG. 1 is a diagram illustrating the semiconductor device according to an example of the present invention.

Hereinafter, the preferable embodiments of the present invention are described with the attached drawings. However, the embodiments of the present invention can be modified and altered in various ways and the present invention is not limited to the following illustration. It is well understood by those in the art who has the average knowledge on this field that the embodiments of the present invention are given to explain the present invention more precisely. Therefore, the shape and size of the elements in the drawings may be exaggerated for clarity of illustration and the elements indicated by the same mark in the drawings are the same elements. The factors showing similar function or activity are also indicated by the same mark in all the drawings. In addition, the inclusion of an element throughout the specification does not exclude other elements, but may include other elements, unless specifically stated otherwise.

Semiconductor Device

FIG. 1 is a diagram illustrating the semiconductor device (1000) according to an example of the present invention.

As shown in FIG. 1, the semiconductor device (1000) according to an example of the present invention comprises: the first electrode (1100); the cell arranged on the first electrode and including the magnetic tunnel junction (MTJ) having the free magnetic layer (1211) and the pinned magnetic layer (1213) with the dielectric layer (1212) in between them; and the heating element to form the thermal gradient in the first electrode.

The first electrode (1100) can include a conductive material. The first electrode can include at least one or more materials selected from the group consisting of Hf, Ta, W, Ir, Pt, Pd, and the alloy thereof. Additionally, the first electrode can contain heavy metals.

The first electrode (1100) can supply spin current to the free magnetic layer arranged on the first electrode, and the spin current can generate the spin orbit torque. The electrical or magnetic characteristics of the free magnetic layer can be changed by the spin orbit torque. The current flowing on the first electrode can be in a forward direction or a reverse direction, thereby the direction of the magnetization switching can be changed. Since the first electrode (1100) can change the characteristics of each cell, the first electrode plays a role as a write line in the semiconductor device (1000).

The free magnetic layer (1211) is the one that allows changes of the magnetic characteristics including the magnetization direction. The magnetic characteristics of the free magnetic layer (1211) can be altered by the surrounding electrical and magnetic properties. In addition, the perpendicular anisotropy may be applied to the film plane of the first electrode (1100)-free magnetic layer (1211). The electrical or magnetic characteristics, in particular the magnetization direction, of the free magnetic layer can be changed by the in-plane current flowing on the first electrode.

The free magnetic layer (1211) can include at least one or more materials selected from the group consisting of Fe, Co, Ni, B, Si, Zr, Pt, Pd, and the alloy thereof.

Even though current is flowing in the first electrode (1100), when the flowing current is not enough to change the magnetic characteristics of the free magnetic layer (1211), the magnetic characteristics of the free magnetic layer (1211) is not changed. Only when enough current is flowing in the first electrode (1100), the magnetic characteristics of the free magnetic layer (1211) can be changed. The current value at this time is called the critical current of the free magnetic layer (1211). That is, the electrical and magnetic characteristics of the free magnetic layers (1211) can be changed by flowing current more than the critical current in the first electrode (1100).

The pinned magnetic layer (1213) can include a material having perpendicular anisotropy, i.e., the material having a fixed magnetization direction in a perpendicular direction to the film plane. More specifically, the pinned magnetic layer can include at least one or more materials selected from the group consisting of Fe, Co, Ni, B, Zr, Pt, Pd, and the alloy thereof.

The semiconductor device can comprise the magnetic tunnel junction having the free magnetic layer and the pinned magnetic layer separated by the dielectric layer. More specifically, the semiconductor device can have the dielectric layer on the free magnetic layer, and have the pinned magnetic layer on the dielectric layer, arranging the free magnetic layer and the pinned magnetic layer facing each other with the dielectric layer. The dielectric layer plays a role in limiting the electrical connection between the fixed magnetic layer (1213) and the free magnetic layer. The dielectric layer can include at least one or more compounds selected from the group consisting of aluminum oxide, magnesium oxide, tantalum oxide, and zirconium oxide, but not always limited thereto.

The first electrode, the free magnetic layer and the pinned magnetic layer can be formed by a general process for thin film deposition, such as atomic layer deposition (ALD), chemical vapor deposition (CVD), and physical vapor deposition (PVD). The thickness of each layer can be several nm to several tens nm, but not always limited thereto.

The heating element can form the thermal gradient in the first electrode.

The heating element can include the identical material as the first electrode, and may not be structurally different. For example, the first electrode can include tungsten and the heating element may also include tungsten.

Figure 2:
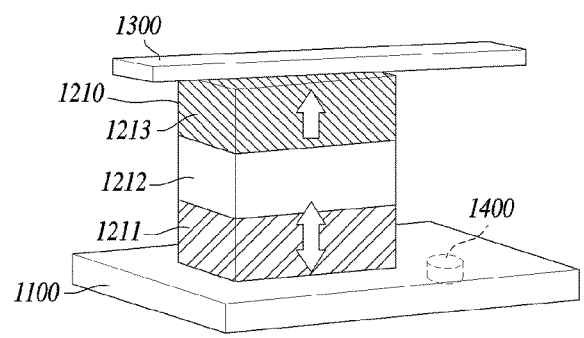
FIG. 2 is a diagram illustrating the semiconductor device including the heating element arranged in the first electrode.

FIG. 2 is a diagram illustrating the semiconductor device including the heating element arranged in the first electrode. As shown in FIG. 2, the heating element can be formed inside the first electrode in order to form the thermal gradient in the first electrode.

Figure 3:
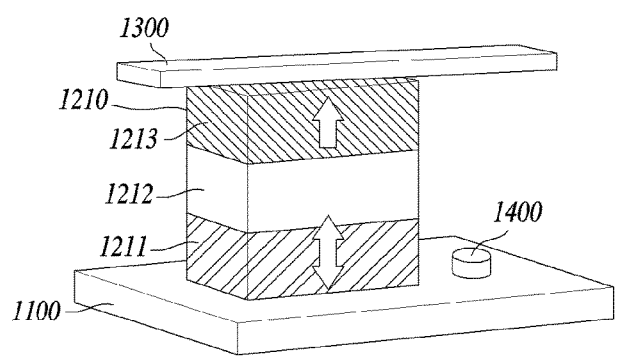
FIG. 3 is a diagram illustrating the semiconductor device including the heating element arranged on the first electrode.

FIG. 3 is a diagram illustrating the semiconductor device including the heating element arranged on the first electrode. As shown in FIG. 3, the heating element can be formed on the first electrode.

Alternatively, the heating element can be arranged to be in thermal or electrical contact with the first electrode, and the arranged position and the shape of the heating element may not be particularly limited.

The direction in which the thermal gradient is formed by the heating element can be the direction of the current applied in the first electrode.

The direction in which the thermal gradient is formed by the heating element can be formed depending on the current applied in the first electrode. Accordingly, the direction in which the thermal gradient is formed by the heating element can be preferably formed depending on the current or the current density formed in the first electrode. For example, when the current is applied in the first electrode and the current is concentrated along the current direction to an interface adjacent area where the free magnetic layer and the first electrode are in contact, the thermal gradient can be formed accordingly.

The magnetization direction of the free magnetic layer (1211) can be changed by the thermal gradient formed by the heating element.

Even though current is flowing in the first electrode, when the flowing current is not enough to change the magnetic characteristics of the free magnetic layer, the magnetic characteristics of the free magnetic layer is not changed. Only when enough current is flowing in the first electrode, the magnetic characteristics of the free magnetic layer can be changed. The current value at this time is called the critical current of the free magnetic layer. That is, the electrical and magnetic characteristics of the free magnetic layers can be changed by flowing current more than the critical current in the first electrode. At this time, the magnetization direction of the free magnetic layer can be changed by the thermal gradient formed by the heating element, and the critical current value of the free magnetic layer can be changed by the thermal gradient formed by the heating element.

The semiconductor device (1000) according to an example of the present invention may further comprise the second electrode electrically connected to the pinned magnetic layer, and the second electrode (1300) can include a conductive material. The second electrode (1300) can include at least one or more materials selected from the group consisting of Ni, W, Cu, and the alloy thereof, but not always limited thereto.

The electrical and magnetic characteristics of each cell can be recognized by the second electrode. Therefore, the second electrode plays a role as a read line in the semiconductor device. At this time, since the magnitude of the current flowing on the second electrode (1300) might be sufficient for reading the electrical or magnetic characteristics of each cell; but lower than the critical current of the magnetization switching, the magnetic characteristics of the free magnetic layer (1211) and the pinned magnetic layer (1213) might not be changed.

As shown in FIG. 1, the magnetization direction of the free magnetic layer (1211) can be changed in the two different directions as indicated by the arrows facing up and down. On the other hand, the magnetization direction of the pinned magnetic layer might not be changed as indicated by the arrow facing only upward.

The semiconductor device (1000) according to an example of the present invention uses the technology of switching the free magnetic layer using the spin orbit torque by the in-plane current flowing on a nonmagnetic material adjacent to the free magnetic layer in the magnetic tunnel junction structure. This technology is in contrast to the spin transfer torque technology driven by the current in a vertical direction conventionally. Additionally, it has the effects of solving the conventional problems of highly integrated magnetic device by a low critical current density, high thermal stability, device stability and the like.

The first electrode (1100) can have a thickness or width gradient in a direction of the current flow.

The first electrode (1100) can be heated by Joule heating by the current flowing in the first electrode. Joule heating is dependent on a resistance of a medium in which the current flows, but may also be dependent on a cross-sectional area. Therefore, when the lateral cross-sectional area of the first electrode has a thickness or width gradient, the heat may be increased by Joule heating by the reduced cross-sectional area.

In the semiconductor device according to an example of the present invention, the heating element (1400) can include a heating device.

The heating device can include a heating member to generate heat, an electricity applying means to apply electricity to the heating member, and a heating device switch to control the electricity applying means. The heating member can include a material having a thermal resistivity greater than that of the first electrode. The heating member can increase thermal energy depending on a magnitude of the current applied on the heating member, and thus the thermal energy generated in the heating element can be controlled. At this time, the thermal gradient in the first electrode can be selectively controlled according to the position where the heating element is arranged and the selective operation.

The heating element (1400) can include the material having an electrical conductivity greater than that of the first electrode.

In the semiconductor device according to an example of the present invention, the heating element arranged on the first electrode can include the material having the electrical conductivity greater than that of the first electrode, and Joule heating can be generated by the current flowing on the heating element and the first electrode at the time of operating the semiconductor device. The current flowing in the first electrode and the heating element can be concentrated by deflecting toward the higher electrical conductivity according to the characteristics of the current. Accordingly, the current density can be concentrated to the heating element, thereby generating the thermal gradient on the heating element.

The heating element (1400) can be formed by a general process for selectively forming materials in the semiconductor device, such as a photolithography process, an etching process and a deposition process.

The heating element (1400) can include at least one of oxide and nitride of the material contained in the first electrode. For example, alumina ($Al_2O_3$) or aluminum nitride (AlN) can be included when the first electrode is an aluminum electrode.

The oxide and nitride of the material contained in the first electrode can be formed by selective oxidization and nitriding of the material contained in the first electrode.

The oxide can be formed by an oxygen ion implantation to the first electrode. For example, if the first electrode is tungsten, the oxygen ion implantation is performed to a center portion among the thickness of the first electrode or a desired location, for the oxygen ion implanted in heavy metal can selectively oxidize tungsten in a subsequent heat treatment, so as to form the heating element having a resistivity greater than that of the first electrode. At this time, the photolithography process can be performed together in order to selectively implant the oxygen ion inside tungsten. The method of oxidizing and nitriding of the first electrode is not limited thereto.

The semiconductor device (1000) according to an example of the present invention may further comprise the insulation structure formed on at least a portion of the first electrode.

The insulation structure can be formed in a multilayer structure having at least one layer having the thermal conductivity lower than that of the first electrode, and can be formed as a capping structure for the first electrode. The method for forming the insulation structure may not be limited thereto. The insulation structure can prevent dissipating the heat generated in the first electrode and the heating element, and can be the materials having the thermal conductivity lower than that of the first electrode. For example, when the insulation structure has three layers, the three layers can be made of different materials from each other. When the insulation structure is formed by three different layers, each layer can have lattice structures, densities and thermal conductivities which are different from each other, enabling effective control of dissipating heat from the first electrode and the heating element by interfaces of the multilayer structure. As such, the thermal gradient can be regulated in the first electrode of the semiconductor device according to an example of the present invention, enabling to regulate by asymmetric thermal gradient.

The semiconductor device (1000) according to an example of the present invention may further comprise the heat dissipating structure formed on at least a portion of the first electrode.

The heat dissipating structure can be formed by contacting at least a portion of the first electrode, and can be formed as a heat channel or a heat sink for dissipating the heat generated in the first electrode and the heating element, by transferring the heat generated from the first electrode. The heat dissipating structure can have various shapes such as a straight line, '┐', '└' shapes or the like, but not limited thereto, with one end coming into contact with the first electrode, and with the other end coming into contact with air. The heat dissipating structure can be wrapped by insulation materials. Preferably, the heat dissipating structure can be formed by the material having the high thermal conductivity. The heat dissipating structure is capable of regulating the heat generated in the first electrode of the semiconductor device according to an example of the present invention, enabling to regulate by asymmetric thermal gradient.

Figure 4:
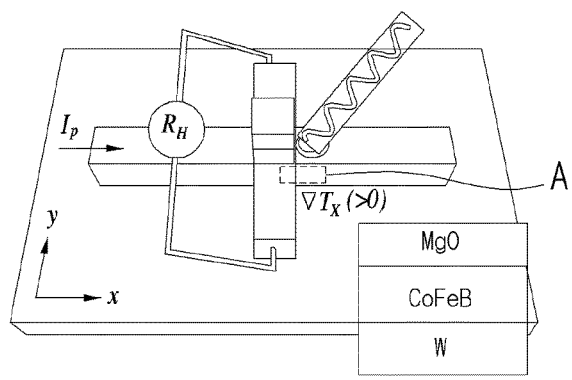
FIG. 4 is a diagram illustrating irradiation of the external energy source to the first electrode of the semiconductor device.

FIG. 4 is a diagram illustrating irradiation of the external energy source to the first electrode of the semiconductor device. In FIG. 4, the first electrode is formed in a thickness of 5 nm by tungsten (W), with the free magnetic layer of CoFeB is formed in a thickness of 1 nm on the first electrode, and with MgO formed in a thickness of 1.6 nm on the free magnetic layer. At this time, the current ($I_p$) is applied in the first electrode in a single direction, and the thermal gradient ($\nabla T_x > 0$) is formed on the heating element using the external energy source. The very small aperture laser (VSAL) is used as the external energy source, and the heat energy generated at the heating element can be regulated by a laser irradiation power applied on the heating element.

Figure 5:
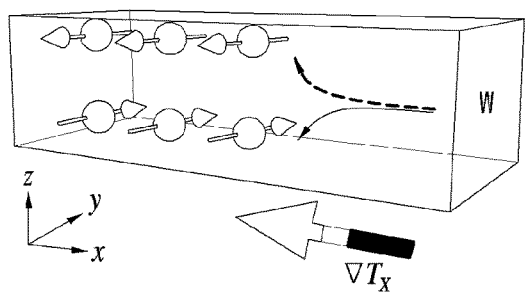
FIG. 5 is a diagram illustrating the thermal spin torque according to applying heat at position A in FIG. 4.

FIG. 5 is a diagram illustrating the thermal spin torque according to applying heat at the position A in FIG. 4.

As shown in FIG. 5, when the thermal gradient ($\nabla T_x > 0$) is formed using the external energy source on the heating element, the spin current can be generated by the thermal gradient of the heating element, and the spin torque can be generated. Accordingly, the magnetization switching behavior can be changed in the free magnetic layer of the semiconductor device.

Figure 6:
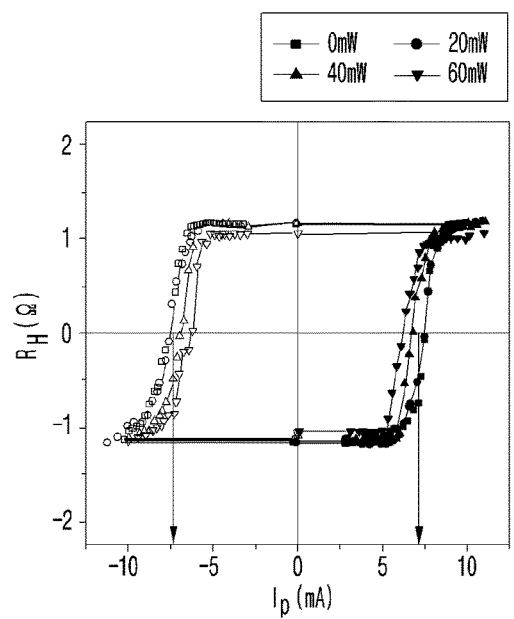
FIG. 6 is a diagram illustrating the magnetization behavior of the semiconductor device by applying symmetric heat gradient.

FIG. 6 is a diagram illustrating the behavior of the magnetization direction of the semiconductor device by applying symmetric heat gradient.

As shown in FIG. 6, the width of the switching curves refers to the critical current ($I_C$) and the switching efficiency in the graph of FIG. 6. As shown in FIG. 6, as the power of the laser irradiated to the first electrode is increased, the critical current for magnetization switching of the free magnetic layer is reduced.

Figure 7:
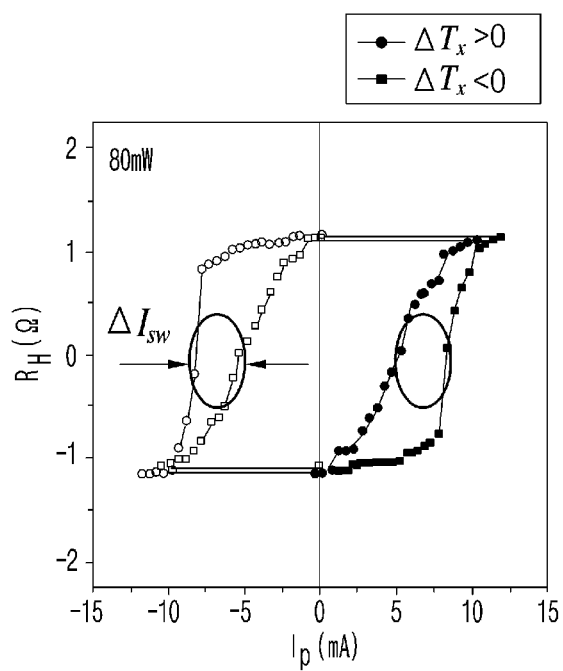
FIG. 7 is a diagram illustrating the magnetization behavior of the semiconductor device by applying asymmetric heat gradient.

FIG. 7 is a diagram illustrating the behavior of the magnetization direction of the semiconductor device by applying asymmetric heat gradient.

As shown in FIG. 7, it is shown that the critical current is more drastically reduced by the asymmetric thermal gradient in the first electrode. Additionally, it is identified that the behavior is changed depending on the direction of the thermal gradient. At this time, the critical current can be drastically reduced in accordance with controlling the direction of the asymmetric thermal gradient.

Figure 8:
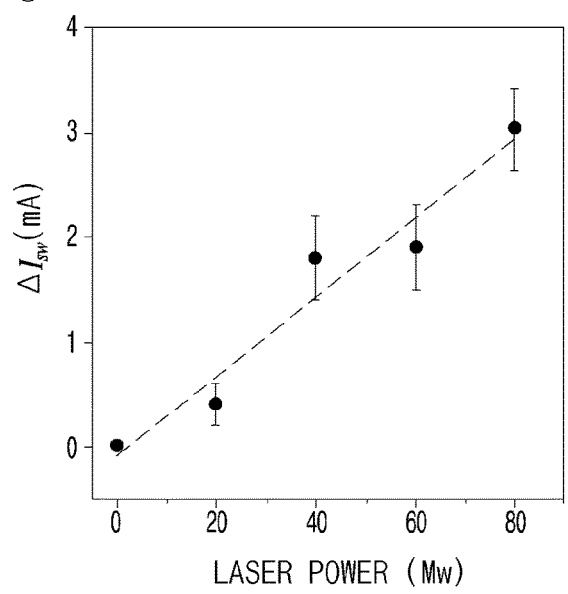
FIG. 8 is a graph illustrating the relationship between the asymmetrically applied heat energy and the critical current value change.

FIG. 8 is a graph illustrating the relationship between the magnitude of the thermal energy of the asymmetric thermal gradient applied to the first electrode and the changes in the critical current. As shown in FIG. 8, the magnitude of the thermal energy of the asymmetric thermal gradient results in the linear decrease in the critical current.

The semiconductor device according to an example of the present invention can easily regulate the critical current for magnetization switching of the semiconductor device to a predefined value, using the thermal gradient formed on the heating element. Thereby, it can be applied to the semiconductor device having varied critical currents depending on the thermal gradient by using a single semiconductor device.

Semiconductor Device Control Method

Figure 9:
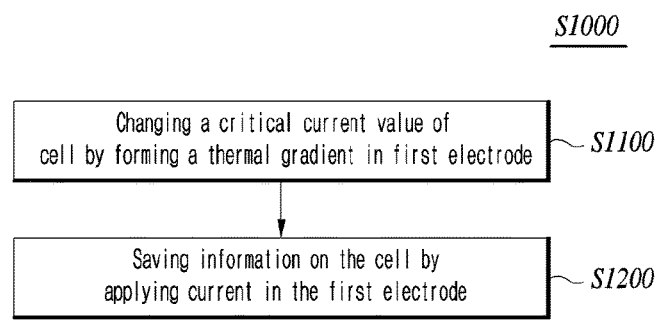
FIG. 9 is a flowchart of a method for controlling the semiconductor device according to an example of the present invention.

FIG. 9 is a flowchart of the method for controlling the semiconductor device according to an example of the present invention.

As shown in FIG. 9, the method (S1000) for controlling the semiconductor device comprising the first electrode, the cell arranged on the first electrode and including the magnetic tunnel junction (MTJ) having the free magnetic layer and the pinned magnetic layer with the dielectric layer in between them, and the heating element to form the thermal gradient in the first electrode comprises the following steps of, changing the critical current value of the cell by forming the thermal gradient in the first electrode (S1100); and saving information on the cell by applying current in the first electrode (S1200).

Firstly, the following describes the step of changing the critical current value of the cell by forming the thermal gradient in the first electrode (S1100).

In the method for controlling the semiconductor device according to example of the present invention, the thermal gradient formed in the first electrode can change the critical current value for the magnetization switching of the free magnetic layer.

Additionally, the following describes the step of saving information on the cell by applying current in the first electrode (S1200).

In the preceding step, the critical current value for the magnetization switching is changed by the thermal gradient formed in the first electrode, followed by applying the current on the cell and thereby saving the information on each cell.

In the step of forming the thermal gradient in the first electrode, the method for forming the thermal gradient in the first electrode can be performed by applying current on the heating element.

In the method for controlling the semiconductor device according to example of the present invention, the heating element can include the materials having the thermal conductivity lower than that of the first electrode, and the heating element can have separated wiring from the semiconductor device. Accordingly, the thermal energy generated in the heating element can be independently controlled by the amount of current applied on the heating element.

In the step of forming the thermal gradient in the first electrode, a method for forming the thermal gradient in the first electrode can be performed by irradiating energy source to the first electrode.

Optical Switch

Figure 10:
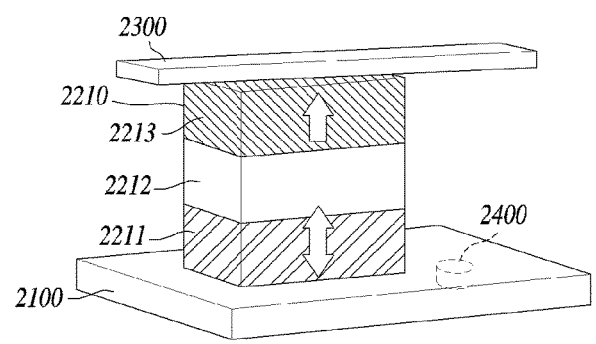
FIG. 10 is a diagram illustrating the optical switch according to an example of the present invention.

FIG. 10 is a diagram illustrating the optical switch according to an example of the present invention.

As shown in FIG. 10, the optical switch (2000) according to an example of the present invention comprising: the first electrode (2100); and the cell (2210) arranged on the first electrode (2100) and including the magnetic tunnel junction (MTJ) having the free magnetic layer (2211) and the pinned magnetic layer (2213) with the dielectric layer (2212) in between them, wherein the first electrode comprises a light receiving element (2400).

The first electrode (2100) can include a conductive material. The first electrode can include at least one or more materials selected from the group consisting of Hf, Ta, W, Ir, Pt, Pd, and the alloy thereof. Additionally, the first electrode can contain heavy metals.

The first electrode (2100) can supply current to the free magnetic layer arranged on the first electrode, and the current can generate the spin orbit torque. The electrical or magnetic characteristics of the free magnetic layer can be changed by the spin orbit torque. The current flowing in the first electrode can be in a forward direction or a reverse direction, thereby the direction of the magnetization switching can be changed. Since the first electrode (2100) can change the characteristics of each cell, the first electrode plays a role as a write line in the optical switch (2000).

The free magnetic layer (2211) is the one that allows changes of the magnetic characteristics including the magnetization direction. The magnetic characteristics of the free magnetic layer (2211) can be altered by the surrounding electrical and magnetic properties. In addition, the free magnetic layer (2211) can include a material having magnetic anisotropy in a perpendicular direction to the lamination (film) plane of the first electrode (2100). The electrical or magnetic characteristics, in particular the magnetization direction, of the free magnetic layer can be changed by the in-plane current flowing in the first electrode.

The free magnetic layer (2211) can include at least one or more materials selected from the group consisting of Fe, Co, Ni, B, Si, Zr, Pt, Pd, and the alloy thereof.

Even though current is flowing in the first electrode (2100), when the flowing current is not enough to change the magnetic characteristics of the free magnetic layer (2211), the magnetic characteristics of the free magnetic layer (2211) is not changed. Only when enough current is flowing in the first electrode (2100), the magnetic characteristics of the free magnetic layer (2211) can be changed. The current value at this time is called the critical current of the free magnetic layer (2211). That is, the electrical and magnetic characteristics of the free magnetic layers (2211) can be changed by flowing current more than the critical current in the first electrode (2100).

The pinned magnetic layer (2213) can include a material having perpendicular anisotropy, i.e., the material having a fixed magnetization direction in a perpendicular direction to the film plane. More specifically, the pinned magnetic layer can include at least one or more materials selected from the group consisting of Fe, Co, Ni, B, Zr, Pt, Pd, and the alloy thereof.

The optical switch (2000) can comprise the magnetic tunnel junction having the free magnetic layer and the pinned magnetic layer separated by the dielectric layer. More specifically, the optical switch can have the dielectric layer on the free magnetic layer, and have the pinned magnetic layer on the dielectric layer, arranging the free magnetic layer and the pinned magnetic layer facing each other with the dielectric layer. The dielectric layer plays a role in limiting the electrical connection between the fixed magnetic layer (2213) and the free magnetic layer. The dielectric layer can include at least one or more compounds selected from the group consisting of aluminum oxide, magnesium oxide, tantalum oxide, and zirconium oxide, but not always limited thereto.

The first electrode, the free magnetic layer and the pinned magnetic layer can be formed by a general process for thin film deposition, such as atomic layer deposition (ALD), chemical vapor deposition (CVD), and physical vapor deposition (PVD). The thickness of each layer can be several nm to several tens nm, but not always limited thereto.

Optical Switch

The optical switch (2000) according to an example of the present invention may further comprise the second electrode (2300) electrically connected to the pinned magnetic layer, and the second electrode (2300) can include a conductive material. The second electrode (2300) can include at least one or more materials selected from the group consisting of Ni, W, Cu, and the alloy thereof, but not always limited thereto.

The electrical and magnetic characteristics of each cell can be recognized by the second electrode (2300). Therefore, the second electrode plays a role as a read line in the optical switch. At this time, since the magnitude of the current flowing on the second electrode (2300) might be sufficient for reading the electrical or magnetic characteristics of each cell; but lower than the critical current of the magnetization switching, the magnetic characteristics of the free magnetic layer (2211) and the pinned magnetic layer (2213) might not be changed.

The magnetization direction of the free magnetic layer (2211) can be changed in the two different directions as indicated by the arrows facing up and down. On the other hand, the magnetization direction of the pinned magnetic layer (2213) might not be changed as indicated by the arrow facing only upward.

The optical switch (2000) according to an example of the present invention uses the technology of switching the free magnetic layer using the spin orbit torque by the in-plane current flowing on a nonmagnetic material adjacent to the free magnetic layer in the magnetic tunnel junction structure. This technology is in contrast to the spin transfer torque technology driven by the current in a vertical direction conventionally. Additionally, it has the effects of solving the conventional problems by a low critical current density, high thermal stability, device stability and the like.

The light receiving element (2400) can receive the external energy source, so as to change the temperature. The external energy source can be irradiated to the light receiving element (2400), and form the thermal gradient in the first electrode as being heated or cooled down according to the energy source applied thereon. The light receiving element (2400) can include the heating device to form a temperature gradient according to the energy source applied thereon.

The optical switch (2000) according to an example of the present invention does not change the electrical and magnetic characteristics of the free magnetic layer when the current applied in the first electrode is less than the critical current. The electric and magnetic characteristics of the free magnetic layer can be changed by applying the current which is less than the critical current and simultaneously applying the energy source to the light receiving element (2400).

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

BRIEF DESCRIPTION OF THE MARK OF DRAWINGS

1000: semiconductor device
1100: first electrode
1210: memory cell
1211: free magnetic layer
1212: dielectric layer
1213: pinned magnetic layer
1300: second electrode
1400: heating element
2000: optical switch
2100: first electrode
2110: light receiving element
2210: memory cell
2211: free magnetic layer
2212: dielectric layer
2213: pinned magnetic layer
2300: second electrode
2400: light receiving element

What is claimed is:

1. A semiconductor device comprising:
   a first electrode configured to flow an in-plane current;
   a cell arranged on the first electrode and including a magnetic tunnel junction (MTJ) having a free magnetic layer and a pinned magnetic layer with a dielectric layer in between them; and
   a heating element to form a thermal gradient in the first electrode that changes a critical current of the cell.

2. The semiconductor device according to claim 1, wherein a magnetization direction of the free magnetic layer is aligned in a perpendicular direction to a film direction of the cell to have a perpendicular anisotropy.

3. The semiconductor device according to claim 1, wherein the heating element is arranged on the first electrode.

4. The semiconductor device according to claim 1, wherein a direction in which the thermal gradient is formed by the heating element is a current direction applied on the first electrode.

5. The semiconductor device according to claim 1, wherein the magnetization direction of the free magnetic layer is changed by the thermal gradient formed by the heating element.

6. The semiconductor device according to claim 1, wherein the first electrode has a thickness or a width gradient in a current direction.

7. The semiconductor device according to claim 1, wherein the heating element comprises a heating device.

8. The semiconductor device according to claim 1, wherein the heating element comprises a material having a conductivity greater than that of the first electrode.

9. The semiconductor device according to claim 1, further comprising an insulation structure formed on at least a portion of the first electrode.

10. The semiconductor device according to claim 1, further comprising a heat dissipating structure formed on at least a portion of the first electrode.

11. A method for controlling a semiconductor device comprising a first electrode configured to flow an in-plane current, a cell arranged on a first electrode and including a magnetic tunnel junction (MTJ) having a free magnetic layer and a pinned magnetic layer with a dielectric layer in between them, and a heating element to form a thermal gradient in the first electrode that changes a critical current of the cell, comprising the following steps of:
    changing the critical current value of the cell by forming the thermal gradient in the first electrode; and
    saving information on the cell by applying current in the first electrode.

12. The method for controlling the semiconductor device according to claim 11, further comprising the step of:
    reading the information of the cell by applying current through the cell.

13. The method for controlling the semiconductor device according to claim 11, wherein forming the thermal gradient in the first electrode is performed by applying current on the heating element.

14. The method for controlling the semiconductor device according to claim 11, wherein forming the thermal gradient in the first electrode is performed by irradiating lights to the first electrode.

15. An optical switch comprising:
    a first electrode configured to flow an in-plane current; and
    a cell arranged on a first electrode and including a magnetic tunnel junction (MTJ) having a free magnetic layer and a pinned magnetic layer with a dielectric layer in between them, wherein the first electrode comprises a light receiving element configured to produce a thermal gradient in the first electrode that changes a critical current of the cell.

16. The optical switch according to claim 15, wherein the light receiving element change temperature by receiving an external energy source.

* * * * *